(12) United States Patent
Taylor et al.

(10) Patent No.: US 8,012,670 B2
(45) Date of Patent: Sep. 6, 2011

(54) PHOTORESIST SYSTEMS

(75) Inventors: Gary N. Taylor, Northboro, MA (US);
Cheng-Bai Xu, Southboro, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 10/412,640

(22) Filed: Apr. 11, 2003

(65) Prior Publication Data
US 2004/0029042 A1    Feb. 12, 2004

Related U.S. Application Data

(60) Provisional application No. 60/372,471, filed on Apr. 11, 2002.

(51) Int. Cl.
*G03F 7/20* (2006.01)
*G03F 7/11* (2006.01)

(52) U.S. Cl. ...... 430/272.1; 430/311; 430/319; 430/330

(58) Field of Classification Search .......... 430/270.1, 430/269, 311, 286.1, 319; 378/34
See application file for complete search history.

(56) References Cited

U.S. PATENT DOCUMENTS

| | | | | |
|---|---|---|---|---|
| 4,760,013 A * | 7/1988 | Hacker et al. | ............ | 430/280.1 |
| 4,904,564 A * | 2/1990 | Chiong | ............ | 430/156 |
| 5,525,457 A | 6/1996 | Nemoto et al. | | |
| 5,693,691 A * | 12/1997 | Flaim et al. | ............ | 523/436 |
| 5,851,730 A * | 12/1998 | Thackeray et al. | ........ | 430/271.1 |
| 5,935,760 A | 8/1999 | Shao et al. | | |
| 6,033,830 A | 3/2000 | Sinta et al. | | |
| 6,042,990 A | 3/2000 | Shao et al. | | |
| 6,048,662 A | 4/2000 | Bruhnke et al. | | |
| 6,080,530 A | 6/2000 | Shao et al. | | |
| 6,156,479 A | 12/2000 | Meador et al. | | |
| 6,190,839 B1 | 2/2001 | Pavelchek et al. | | |
| 6,261,743 B1 | 7/2001 | Pavelchek et al. | | |
| 6,306,554 B1 | 10/2001 | Barclay et al. | | |
| 6,316,165 B1 | 11/2001 | Pavelchek et al. | | |
| 6,323,310 B1 | 11/2001 | Puligadda et al. | | |
| 6,410,209 B1 | 6/2002 | Adams et al. | | |
| 6,444,320 B1 | 9/2002 | Takei et al. | | |
| 6,503,689 B2 | 1/2003 | Zampini et al. | | |
| 6,524,708 B2 | 2/2003 | Puligadda et al. | | |
| 6,528,235 B2 | 3/2003 | Thackeray et al. | | |
| 6,576,681 B2 | 6/2003 | Zampini et al. | | |
| 6,599,951 B2 | 7/2003 | Zampini et al. | | |
| 6,602,652 B2 | 8/2003 | Adams et al. | | |
| 6,605,394 B2 * | 8/2003 | Montgomery et al. | ........... | 430/5 |
| 6,653,049 B2 | 11/2003 | Pavelchek et al. | | |
| 2002/0022196 A1 | 2/2002 | Pavelchek et al. | | |
| 2002/0028408 A1 | 3/2002 | Mao et al. | | |
| 2002/0031729 A1 | 3/2002 | Trefonas et al. | | |
| 2002/0045125 A1 | 4/2002 | Shao et al. | | |
| 2002/0055061 A1 * | 5/2002 | Taylor et al. | ............ | 430/270.1 |
| 2003/0065164 A1 | 4/2003 | Puligadda et al. | | |
| 2003/0129531 A1 | 7/2003 | Oberlander et al. | | |
| 2003/0129542 A1 | 7/2003 | Shih et al. | | |
| 2003/0180559 A1 | 9/2003 | Wayton et al. | | |
| 2003/0219603 A1 | 11/2003 | Teng et al. | | |
| 2003/0228474 A1 | 12/2003 | Taylor et al. | | |

FOREIGN PATENT DOCUMENTS
WO     WO 02/086624    10/2002

* cited by examiner

*Primary Examiner* — Daborah Chacko Davis
(74) *Attorney, Agent, or Firm* — Peter F. Corless; The Dow Chemical Company

(57) ABSTRACT

New photoresist systems are provided that comprise an underlying processing (or barrier) layer composition and an overcoated photoresist layer. Systems of the invention can exhibit significant adhesion to SiON and other inorganic surface layers.

18 Claims, No Drawings

PHOTORESIST SYSTEMS

The present application claims the benefit of U.S. application No. 60/372,471, filed Apr. 11, 2002, which is incorporated herein by reference in its entirety.

BACKGROUND OF THE INVENTION

1. Field of the Invention

The present invention relates to new photoresist composition systems that are suitable for short wavelength imaging, including sub-300 nm and sub-200 nm such as 248 nm, 193 nm and 157 nm. Photoresist systems of the invention include a photoresist layer coated over an organic processing layer. That multiple layer composite can exhibit significant adhesion to SiON and other inorganic surface layers. Preferred processing layer compositions comprise one or more components that have hetero atom substitution, particularly moieties that comprise one or more N, O or S atoms such as hydroxyl groups.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

While currently available photoresists are suitable for many applications, current resists also can exhibit significant shortcomings, particularly in high performance applications such as formation of highly resolved sub-quarter micron and sub-tenth micron features. Among other things, undesired footing of the photoresist relief image and so-called "scum" (non-removed organic residues) in developed areas may occur, which will compromise subsequent lithographic processing.

Consequently, interest has increased in photoresists that can be photoimaged with short wavelength radiation, including exposure radiation of below 300 nm such as 248 nm, or even 200 nm or less such as 193 nm. Quite recently, $F_2$ excimer laser imaging, i.e. imaging with radiation having a wavelength of about 157 nm, has been considered as a route to manufacture of even smaller features. See, generally, Kunz et al., SPIE Proceedings (Advances in Resist Technology), vol. 3678, pages 13-23 (1999).

Silicon oxynitride (SiON) layers and other inorganics such as $Si_3N_4$ coatings have been employed in semiconductor device manufacture, for example as an etch stop layer and an inorganic antireflective layer. See, for instance, U.S. Pat. Nos. 6,124,217; 6,153,504; and 6,245,682.

It would be desirable to have new photoresist systems that would provide good resolution on SiON and other inorganic substrate layers.

SUMMARY OF THE INVENTION

We now provide new photoresist systems that can provide enhanced adhesion to an underlying substrate, including a substrate having an inorganic surface layer such as a SiON layer or silicon nitride layer.

More particularly photoresist systems of the invention comprise an organic processing layer coating applied over a substrate and a photoresist layer applied over the processing layer.

Preferably, the processing layer comprises one or more organic components with one or more of such components having functionalities that comprise N, O or S atoms, such as amide, epoxy, hydroxyl, carboxy (—COOH), ester (e.g. —C=OOR where R is optionally substituted 1 through 18 alkyl), alkanoyl such as $C_{1-18}$alkanoyl including acetyl, alkoxy including $C_{1-18}$alkoxy, alkylthio such as $C_{1-18}$alkylthio, and the like.

Processing layers that comprise hydroxyl or epoxy moieties are particularly preferred. For instance, the processing layer may comprise a polymeric or non-polymeric material that comprises hydroxy or epoxy groups. More particularly, a polymeric material may contain polymerized units of a hydroxyl acrylate such as hydroxyethyl acrylate and 3-hydroxypropyl acrylate. Alternatively, the hetero atom-containing component may be a non-polymeric material such as a hydroxy or alkoxymethyl ethers that can react with a hydroxy functionality as well as steroidal compounds that have hydroxy functionality.

Suitable hetero atom-containing components (also referred to herein as adhesion promoting materials or components) of the processing layer that can provide enhanced adhesion and resolution also can be readily identified by simple testing, i.e. a candidate hetero atom-containing component can be added to a processing layer composition and that processing layer with overcoated photoresist can evaluated for enhanced adhesion (as may be shown by enhanced lithographic patterning) on a SiON or $Si_3N_4$ substrate surface relative to the adhesion of the same resist overcoated the same processing layer that does not contain the hetero atom-containing material. In general, enhanced adhesion of a photoresist system of the invention (i.e. underlying processing layer with overcoated photoresist) to a SiON or other inorganic substrate may be assessed by the resolution of an imaged and developed overcoated resist layer.

The term adhesion-promoting component or material or hetero-containing component or other similar term of a processing layer composition refers to herein a material that is incorporated into the processing layer and can provide a discernable increase in adhesion of the photoresist system (i.e. processing layer with overcoated photoresist). A discernable increase in adhesion is indicated by enhanced resolution relative to a control resist (same photoresist system processed in same manner, but processing layer does not contain the adhesion-promoting component). Such enhanced resolution can determined by visual inspection of scanning electron micrographs (SEMs) of the photoresist system with candidate adhesion-promoting component (test photoresist system) and the control photoresist system. Thus, a suitable adhesion-promoting component for any given processing layer and photoresist system can be readily identified empirically.

Particularly preferred moieties of an adhesion-promoting component include hydroxyl or epoxy groups. Nitrogen containing groups also will be suitable including nitrogen ring groups. Suitable nitrogen ring moieties include non-aromatic ring groups that have 1 to 3 nitrogen ring atoms and from 4 to about 8 total ring atoms such as an optionally substituted azole, optionally tetrazole, optionally substituted triazole, optionally substituted imidazole, and optionally substituted benzotriazole.

In one aspect, preferred adhesion-promoting components for use in a processing layer composition of the invention are suitably of low or moderate molecular weight, e.g. a molecular weight of less than about 1,500 daltons, more preferably a molecular of less than about 1,000 daltons, and suitably a molecular weight of less than about 700 or 500 daltons. For certain applications, higher molecular weight adhesion-promoting components will be preferred, such as an adhesion-promoting component having a molecular weight of less than 40,000 daltons, more typically from about 1,000 to 20,000 daltons.

In such aspects, the adhesion-promoting components also may be non-polymeric, i.e. not contain multiple repeat units.

In other aspects of the invention, the adhesion-promoting component of a processing layer composition may be suitably polymeric, e.g. contain multiple repeat units with epoxy groups and the like. In such aspects of the invention, the adhesion-promoting component suitably may have relatively higher molecular weights, e.g. a molecular weight in excess of 1,000 or 1,500 daltons. Such polymeric additives however preferably will have a weight average molecular weight in excess of about 5,000, 10,000, or 25,000 daltons.

We also have found that the thickness of the processing layer can be important in providing enhanced adhesion of a photoresist system of the invention to an underlying substrate. References to a processing layer composition thickness are to the dry layer (substantial solvent removal) thickness of the processing layer, e.g. if the processing layer is applied as an organic solvent coating layer, the thickness of the processing layer as referred to herein will be the layer thickness provided by heating the applied coating layer at about 100° C., 110° C. or 120° C. for 30 to 60 seconds or more. Generally, a bake of about 110° C. for 60 seconds will provide a dry processing layer. A dried processing composition layer will not be swelled upon application thereover by a liquid photoresist composition.

Preferably, the processing layer will have a thickness (substantial solvent removal) of at least about 10 nm, 12 nm or 15 nm, more preferably a thickness of at least about 20 nm or 25 nm. A processing layer thickness of greater than about 50, 80 or 100 nm will be less desired for at least some applications. For some applications, a processing layer thickness of greater than 30 or 40 nm will be less suitable than a thinner coating. For many applications, particularly preferred processing layer thicknesses will be from about 20 nm to about 80 nm, even more preferably a thickness of about 10 nm to 20, 30, 40, 50, 60 or 70 nm. Processing layer thicknesses can be determined e.g. by measuring and averaging multiple distinct points (e.g. 3 or more distinct points) of the processing coating layer with an appropriate coating layer measuring tool (e.g. a thermowave or a Prometrix interferometric measuring tool).

Preferred processing layer compositions of the invention can be crosslinked, e.g. by thermal and/or radiation treatment. For example, preferred processing composition layers of the invention may contain a separate crosslinker component that can crosslink with one or more other components of the processing composition. Particularly preferred processing compositions contain as separate components: a resin, a crosslinker, and an acid source such as an acid or more preferably a thermal acid generator or other acid generator. Processing layer compositions are preferably crosslinked prior to application of a photoresist layer over the processing composition layer. Thermal-induced crosslinking of a processing composition layer such as by activation of a thermal acid generator is generally preferred. Suitable crosslinkers of processing layer compositions can vary and preferred crosslinkers include amine-based materials such as melamines, glycourils and urea-based materials.

Processing layer compositions of the invention also may contain one or more photoacid generator compounds (PAG), typically in addition to any other acid source present in the composition such as an acid or thermal acid generator. The processing layer PAG should be substantially stable to lithographic processing prior to radiation exposure of an overcoated photoresist so the PAG can be activated and generate acid during such subsequent exposure of the overcoated resist to patterned radiation. Generally preferred photoacid generators for use in processing layer compositions of the invention include e.g. onium salts such as iodonium and sulfonium compounds including di(4-tert-butylphenyl)iodonium perfluorooctane sulfonate, halogenated photoacid generators such as 1,1-bis[p-chlorophenyl]-2,2,2-trichloroethane and other photoacid generators used with photoresist compositions.

Processing layer compositions suitably may comprise multi-ring aromatic moieties such as anthracene or naphthylene that have been employed as antireflective dyes for photoresist systems. However, the processing layer compositions need not contain such moieties and at the preferred thin layer thicknesses as discussed above, the processing layers do not serve a substantial antireflective function.

Preferred photoresists for use in photoresist systems of the invention can be imaged at relatively short-wavelengths, including sub-300 nm and sub-200 nm wavelengths such as 248 nm, 193 nm and 157 nm.

The invention also includes substrates coated with a photoresist as disclosed herein, including substrates having an inorganic surface coating such as a SiON or $Si_3N_4$ coating. Such inorganic coating layers may be capped with a silicon oxide such as silicon dioxide.

Methods for forming relief images also are provided, including methods for forming a highly resolved relief image such as a pattern of lines (dense or isolated) where each line has vertical or essentially vertical sidewalls and a line width of about 0.25 microns or less, or even about 0.10 microns or less. In such methods, preferably a coating layer of a resist of the invention is imaged with short-wavelength radiation, particularly sub-300 or sub-200 nm radiation, especially 248 nm, 193 nm, and 157 nm radiation, and higher energy radiation such as radiation having a wavelength of less than 100 nm, EUV, electron beam, ion beam or x-ray imaging.

The invention further comprises articles of manufacture comprising substrates such as a microelectronic wafer having coated thereon the photoresists and relief images of the invention. Methods for producing such articles of manufacture also are providing, which generally comprise use of a photoresist of the invention.

Other aspects of the invention are disclosed infra.

DETAILED DESCRIPTION OF THE INVENTION

As discussed above, we now provide new photoresist systems (organic bilayer systems) that comprise a photoresist layer overcoated an underlying processing coating layer. This bilayer system can provide good resist image profile and adhesion over problematic substrates used in microelectronic device manufacture, including inorganic surface coatings such as silicon nitride, silicon oxynitride, silicon, gallium arsenide and the like and such layers that may be capped with a silicon oxide (particularly silicon dioxide).

Processing layer compositions of the invention are preferably organic compositions that may be applied e.g. by spin coating onto a substrate such as a microelectronic wafer.

Preferred processing layer compositions also exhibit rapid etch rates in standard plasma etchants (e.g. oxygen plasma etchants such as a $F_2/O_2$ plasma etchant) to facilitate lithographic processing. Such preferred processing layer compositions may thus have relatively high oxygen content to provide such rapid plasma etch rates.

Preferably, at least one component of the processing layer has a hetero atom-containing moiety, particularly one or more moieties that contain N, O or S atoms, with oxygen-containing moieties being particularly preferred such as hydroxy, epoxy or alkoxy. Nitrogen-containing materials also may be suitable for incorporation in a processing layer composition.

Suitable epoxide compounds to incorporate in a processing layer composition include saturated compounds, e.g. optionally substituted alkyl and cycloalkyl (alicyclic) compounds suitably having 1 to about 25 carbon atoms, more typically 3 to about 18 carbon atoms and at least one epoxide moiety e.g. 1, 2, 3, 4 or more epoxide moieties.

The compounds also may have a variety of substituents in addition to epoxy such as halo (F, Cl, Br, I) particularly fluoro; haloalkyl particularly halo($C_{1-10}$alkyl) especially fluoro($C_{1-10}$alkyl) such as —$CF_3$, —$CH_2CF_3$ and the like; carboxy; alkanoyl such as formyl, acetyl and other $C_{1-12}$alkanoyl; hydroxy, nitro; alkoxy such as $C_{1-12}$alkoxy, alkylthio such as $C_{1-12}$alkylthio; etc. Aromatic compounds, such as phenyl compounds, having epoxide substitution also can be suitable.

Exemplary suitable epoxy-containing components for use in a processing layer composition of the invention include e.g. bisphenol A diglycidyl ether, epoxy novolak, glycidyl poly (hydroxystyrene), poly(glycidyl acrylate), poly(glycidyl methacrylate), etc.

Hydroxy-containing compounds also may be incorporated into a processing composition layer, such as cresols, naphthols and non-aromatic alcohols, including resins with hydroxy groups such as a polyester with hydroxy groups.

A processing layer composition suitably may be a crosslinking composition, e.g. contain a component that crosslinks either with itself or one or more other components of the composition. Preferably, such a processing layer may be crosslinked by thermal treatment, i.e. after application of a processing layer coating on a substrate, the coating layer is thermally treated e.g. at 100° C. to 250° C. for 30 to 120 seconds or at other temperature and/or times where crosslinking occurs. Suitably, the processing layer composition may contain an amine-based material such as a melamine resin or a benzoguanamine resin as well as an acid or acid generator such as a thermal acid generator compound (i.e. a compound that generates acid upon thermal treatment). The amine-based material can crosslink with other composition components such as a resin that contains hydroxy and/or epoxy groups, or with electron-rich aromatic groups.

Alternatively, non-crosslinking processing layer compositions also will be suitable, i.e. where the one or more composition components do not undergo to a significant extent bond-forming reactions after application of the composition to a substrate.

Processing layer compositions are suitably formulated as liquid coating compositions in the same manner as photoresist compositions. Thus the one or more components of a processing layer composition may be admixed in a suitable organic solvent carrier such as ethyl lactate, cyclohexanone, 2-heptanone, propylene glycol methyl ether acetate, and the like. The thus formulated processing layer composition then may be applied to a substrate surface preferably by spin coating, the solvent is removed and the composition crosslinked such as by thermal treatment, if the composition is a crosslinking system. The thickness of the applied coating layer can be maintained to a desired value as discussed above, e.g. by the spinning speed during the spin coat process, the solids content and the viscosity at which the liquid coating composition is formulated, and the like. Thereafter, a photoresist composition coating layer may be applied over the processing layer.

Photoresists used in resist systems of the invention may be positive-acting or negative-acting. Positive resists are generally preferred, particularly chemically-amplified photoresists that contain one or more deblocking components.

Preferred chemically-amplified positive resists contain a photoacid-labile polymer component that contains one or more repeat units that comprise a photoacid-labile moiety, such as a photoacid-labile ester or acetal group. Particularly preferred photoacid-labile groups are discussed below.

Photoresist resins used in resist systems of the invention will be suitably modified depending on the exposure wavelength used. For instance, for photoresists imaged at wavelengths greater than 200 nm such as 248 nm, the resist resin suitably may have aromatic repeat units, particularly phenolic units. For photoresists imaged at less than 200 nm particularly 193 nm, the resist resin suitably will be substantially free of aromatic groups (e.g. less than 5, 4, 3, 2 or 1 mole percent of total units of the polymer being aromatic) and the resin may comprise alicyclic units such as polymerized norbornyl units, e.g. a norbornyl/acrylate copolymer. For resists imaged at 157 nm, preferably the resists will have fluorine substitution such as may be provided by polymerization of a fluorinated olefin, e.g. tetrafluoroethylene (TFE) chlorotrifluoroethylene, hexafluoropropylene, trifluoroethylene, vinylidene fluoride, vinyl fluoride, and the like. Preferred photoresists for imaging at greater than 200 nm particularly 248 nm are disclosed in U.S. Pat. No. 5,879,856. Preferred photoresists for imaging at 193 nm are disclosed in U.S. Pat. No. 6,306, 554. Preferred photoresists for imaging at 157 nm are disclosed in WO 0221212A2. Those patent documents also disclose suitable syntheses of such resins as disclosed herein.

Preferred photoacid-labile groups of a resin used in a photoresist include photoacid-labile acyclic (aliphatic) esters such as a tert-butyl ester, or an ester containing a tertiary alicyclic group. Such photoacid-labile esters may be directly pendant from the resin backbone or other polymer unit such as a carbon alicyclic, heteroalicyclic or other polymer unit (e.g. where the photoacid-labile group is of the formula —C(=O)OR, where R is tert-butyl or other non-cyclic alkyl group, or a tertiary alicyclic group and is directly linked to the polymer backbone or unit), or the ester moieties may be spaced from the polymer backbone or other polymer unit, e.g. by an optionally substituted alkane linkage (e.g. —$(CH_2)_{0-2}$C(=O)OR, where R is tert-butyl or other non-cyclic alkyl group, or a tertiary alicyclic group). Such photoacid-labile groups also suitably may contain fluorine substitution at available positions.

Preferred photoacid-labile tertiary alicyclic hydrocarbon ester moieties are polycyclic groups such adamantyl, ethylfencyl or a tricyclo decanyl moiety. References herein to a "tertiary alicyclic ester group" or other similar term indicate that a tertiary alicyclic ring carbon is covalently linked to the ester oxygen, i.e. —C(=O)O-TR' where T is a tertiary ring carbon of alicyclic group R'. In at least many cases, preferably a tertiary ring carbon of the alicyclic moiety will be covalently linked to the ester oxygen. However, the tertiary carbon linked to the ester oxygen also can be exocyclic to the alicyclic ring, typically where the alicyclic ring is one of the substituents of the exocyclic tertiary carbon. Typically, the tertiary carbon linked to the ester oxygen will be substituted by the alicyclic ring itself, and/or one, two or three alkyl groups e.g. having 1 to about 12 carbons, more typically 1 to about 8 carbons, even more typically 1, 2, 3 or 4 carbons. The alicyclic group also preferably will not contain aromatic substitution. The alicyclic groups may be suitably monocyclic, or polycyclic, particularly bicyclic or tricyclic groups.

Preferred alicyclic moieties (e.g. group TR' of —C(=O)O-TR') of photoacid labile ester groups of polymers of the invention have rather large volume. It has been found that such bulky alicyclic groups can provide enhanced resolution when used in copolymers of the invention.

More particularly, preferred alicyclic groups of photoacid labile ester groups will have a molecular volume of at least about 125 or about 130 Å$^3$, more preferably a molecular volume of at least about 135, 140, 150, 155, 160, 165, 170, 175, 180, 185, 190, 195, or 200 Å$^3$. Alicyclic groups larger than about 220 or 250 Å$^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277-287.

Particularly preferred tertiary alicyclic groups of photoacid-labile units include the following, where the wavy line depicts a bond to the carboxyl oxygen of the ester group, and R is suitably optionally substituted alkyl, particularly $C_{1-6}$ alkyl such as methyl, ethyl, etc.

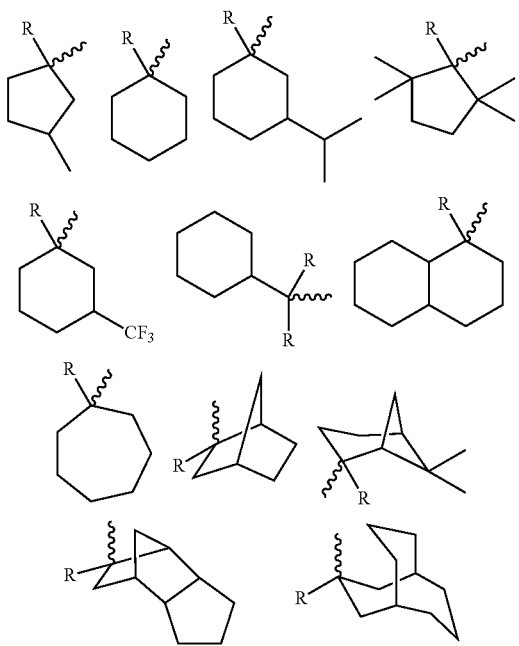

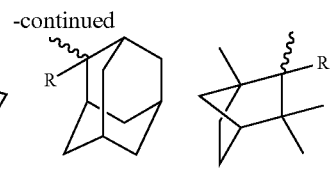

Photoacid-labile polymers may contain photoacid-labile groups that do not contain an alicyclic moiety. For example, polymers of the invention may contain photoacid-labile ester units, such as a photoacid-labile alkyl ester. Generally, the carboxyl oxygen (i.e. the carboxyl oxygen as underlined as follows:

—C(=O)O) of the photoacid-labile ester will be covalently linked to the quaternary carbon. Branched photoacid-labile esters are generally preferred such as t-butyl and —C(CH$_3$)$_2$CH(CH$_3$)$_2$.

In this regard, photoacid-labile polymers used in resists of resist systems of the invention may contain distinct photoacid-labile groups, i.e. the polymer may contain two or more ester groups that have distinct ester moiety substitutions e.g. one ester may have an alicyclic moiety and another ester may have an acyclic moiety such as t-butyl, or the polymer may contain both ester and other functional groups that are photoacid-labile such as acetals, ketals and/or ethers.

As discussed, various polymer and additive components may be optionally substituted. A "substituted" substituent may be substituted at one or more available positions, typically 1, 2, or 3 positions by one or more suitable groups such as e.g. halogen (particularly F); cyano; $C_{1-6}$ alkyl; $C_{1-6}$ alkoxy; $C_{1-6}$ alkylthio; $C_{1-6}$ alkylsulfonyl; $C_{2-6}$ alkenyl; $C_{2-6}$ alkynyl; hydroxyl; nitro; alkanoyl such as a $C_{1-6}$ alkanoyl e.g. acyl and the like; etc.

Polymers used in resists and processing layer compositions may be suitably prepared as disclosed in the above-mentioned patent documents. One suitable method is an addition reaction which may include free radical polymerization, e.g., by reaction of selected monomers to provide the various units as discussed above in the presence of a radical initiator under an inert atmosphere (e.g., N$_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. a halogenated solvent such as a fluorinated solvent or a chlorinated solvent and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed.

Suitable monomers used for preparation of resists of photoresists and processing layer compositions of systems of the invention include e.g. acrylates.

Photoresists used in systems of the invention also will comprise a photoactive component, suitably one or more photoacid generators (i.e. "PAG") that are suitably employed in an amount sufficient to generate a latent image in a coating layer of the resist upon exposure to activating radiation. Preferred PAGs for imaging at 157 nm, 193 nm and 248 nm imaging include imidosulfonates such as compounds of the following formula:

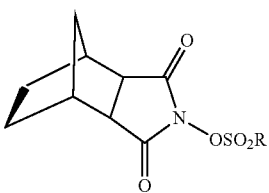

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts for use in photoresists as well as processing layer compositions. Two suitable agents for 193 nm and 248 nm imaging are the following PAGS 1 and 2:

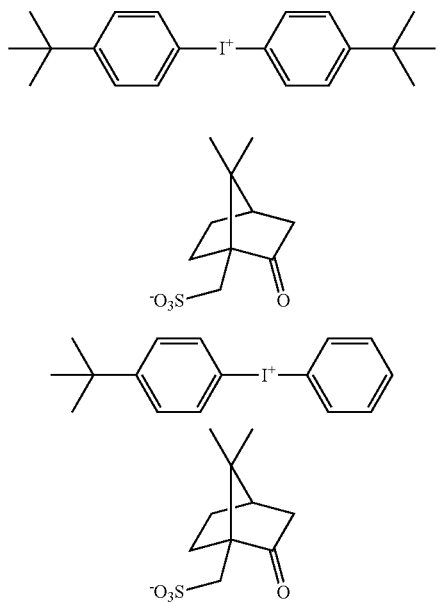

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

For imaging at 157 nm, a triphenyl sulfonium PAG is particularly preferred, complexed with anions such as the sulfonate anions mentioned above, particularly a perfluoroalkyl sulfonate such as perfluorobutane sulfonate.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists used in systems of the invention is an added base, particularly tetrabutylammonium hydroxide lactate, which can enhance resolution of a developed resist relief image. Other suitable added bases include diazabicyclo undecene or diazabicyclononene. The added base is suitably used in relatively small amounts, e.g. about 0.03 to 5 percent by weight relative to the total solids.

Photoresists used in systems of the invention also may contain other optional materials. For example, other optional additives include anti-striation agents, plasticizers, speed enhancers, etc. Such optional additives typically will be present in minor concentrations in a photoresist composition.

Photoresists used in systems of the invention can be readily prepared by those skilled in the art. For example, a photoresist composition of the invention can be prepared by dissolving the components of the photoresist in a suitable solvent such as, for example, 2-heptanone, cyclohexanone, ethyl lactate, propylene glycol monomethyl ether; and propylene glycol monomethyl ether acetate. Typically, the solids content of the composition varies between about 2 and 20 percent by weight of the total weight of the photoresist composition. The resin and photoactive components should be present in amounts sufficient to provide a film coating layer and formation of good quality latent and relief images.

As discussed above, preferably the underlying processing layer coating may be applied such as by spin coating over silicon wafers or silicon wafers coated with silicon dioxide, SiON or $Si_3N_4$ for the production of microprocessors and other microelectronic device substrates. The applied processing layer is then preferably thermally treated to remove solvent carrier. That thermal treatment also may provide crosslinking.

A photoresist may be applied over a processing layer coating such as by spinning or other conventional coating technique. As with the processing layer composition, when spin coating, the solids content of the resist coating solution can be adjusted to provide a desired film thickness based upon the specific spinning equipment utilized, the viscosity of the solution, the speed of the spinner and the amount of time allowed for spinning.

Following coating of the photoresist over a processing composition layer, a resist coating layer is suitably dried by heating to remove the solvent until preferably the photoresist coating is at least essentially free of solvent. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 $mJ/cm^2$, dependent upon the exposure tool and the components of the photoresist composition.

As discussed above, coating layers of the resist compositions are preferably photoactivated by a short exposure wavelength, particularly a sub-300 and sub-200 nm exposure wavelength. 248 nm, 193 nm and 157 nm are preferred exposure wavelength. However, the resist compositions also may be suitably imaged at higher wavelengths.

Following exposure, the film layer of the composition is preferably baked at temperatures ranging from about 70° C. to about 170° C. Thereafter, the film is developed. The exposed resist film is rendered positive working by employing a polar developer, preferably an aqueous based developer such as quaternary ammonium hydroxide solutions such as a tetraalkyl ammonium hydroxide solution, preferably a 0.26 N tetramethylammonium hydroxide aqueous solution; or various amine solutions such as a solution containing ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed underlying surface may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

Example 1

Resist System Preparation and Lithographic Processing

A processing layer composition is prepared by admixing an acrylate polymer that contains polymerized units of hydroxyethyl acrylate formulated in ethyl lactate solvent. That composition is spin coated over an 8" SiON wafer on a Polaris 2000 coating track and baked at 215° C. for 60 seconds to achieve a dried coating layer thickness of about 25 nm.

A photoresist composition containing a photoacid generator compound of triphenylsulfonium perfluorobutane sulfonate, a photoacid-labile polymer prepared by polymerization of monomers comprising tetrafluoroethylene (TFE) and norbornene substituted with hexafluoro-iso-propanol and t-butyl acrylate, basic additive of tetrabutylammonium lactate and solvent of 2-heptanone is spin-coated over the processing composition layer and baked at 145° C. for 60 seconds to remove solvent. The coated wafer is exposed on an Exitech 157 nm stepper (0.60 NA, 0.70σ) for a lines and spaces test pattern, post-exposure baked at 105° C. for 60 sec. and developed for 60 seconds with an aqueous alkaline developer commercially from the Shipley Company. The developed wafers can be evaluated by top-down scanning electron microscope (SEM) for imaging patterns.

Example 2

Further Resist System

A processing layer composition was prepared by admixing the following components: an epoxy novolak polymer; a crosslinker of a tetramethoxymethyl glycoluril; para-toluene sulfonic acid (as an acid source for crosslinking); a surfactant; and a solvent comprising ethyl lactate, cyclohexane and propylene glycol methyl ether.

That processing layer composition was applied by spin coating onto an 8 inch Si wafer. The applied processing layer was baked for 90 seconds to remove solvent and crosslink the layer. A dried crosslinked layer of about 200 angstroms thickness was provided.

A following photoresist composition was applied by spin coating over that crosslinked processing layer. The photoresist was prepared by admixing the following materials: a fluorinated terpolymer obtained by polymerization of tetrafluoroethylene, tetrabutylacrylate and norbornene substituted by —O—$CH_2$—$C(CF_3)_2$—OH (polymer present in amount of 9.434 wt. percent of all resist components); a photoacid generator of triphenyl sulfonium perfluorobutane sulfonate (PAG present in an amount of 0.52 wt. % of all resist components); a base additive (present in an amount of 0.036 wt. % of all resist components); surfactant (present in an amount of 0.01 wt. % of all resist components); and solvent of 2-haptanone (present in an amount of 90 wt. % of all resist components).

The applied resist layer is soft-baked for 60 seconds to remove solvent; exposed to 157 nm patterned radiation at a dose of 50 $mJ/cm^2$; post-exposure baked at about 105° C. for 60 seconds; and developed with an aqueous alkaline developer. Well-resolved 100 nm lines:spaces (1:1) were produced.

The same photoresist also was processed in the same manner but directly onto the Si wafer, i.e. without the underlying processing layer. Development after 157 nm exposure at the same dose (50 $mJ/cm^2$) produced a relief image of reduced resolution (particularly footing of the relief image) relative to the above results where the underlying processing layer was employed.

Example 3

Further Resist System

A processing layer composition was prepared by admixing the following components: a copolymer of hydroxyethyl methylacrylate and methylmethacrylate; a crosslinker of a tetramethoxymethyl glycoluril; a thermal acid generator (Nacure 5225 from King Industries, Norwalk, Conn.); dimethyl adipate; a surfactant; and a solvent comprising methyl-2-hydroxyisobutyrate.

That processing layer composition was applied by spin coating onto an 8 inch Si wafer. The applied processing layer was baked for 90 seconds to remove solvent and crosslink the layer. A dried crosslinked layer of about 200 angstroms thickness was provided.

A following photoresist composition was applied by spin coating over that crosslinked processing layer. The photoresist was the same as disclosed in Example 2 above.

The applied resist layer is soft-baked for 60 seconds to remove solvent; exposed to 157 nm patterned radiation at a dose of 50 $mJ/cm^2$; post-exposure baked at about 105° C. for 60 seconds; and developed with an aqueous alkaline developer. Well-resolved 100 nm lines:spaces (1:1) were produced.

The same photoresist also was processed in the same manner but directly onto the Si wafer, i.e. without the underlying processing layer. Development after 157 nm exposure at the same dose (50 $mJ/cm^2$) produced a relief image of significantly reduced resolution (particularly loss of adhesion to the substrate) relative to the above results where the underlying processing layer was employed The foregoing description of the invention is merely illustrative thereof, and it is understood that variations and modifications can be effected without departing from the spirit or scope of the invention as set forth in the following claims.

What is claimed is:

1. A microelectronic device substrate comprising a silicon oxynitride layer;
   a crosslinked organic processing composition layer over the silicon oxynitride layer, the processing layer comprising
   a photoresist composition layer over the processing layer composition, wherein the photoresist comprises one or more polymers that are chosen from among (i) a polymer substantially free of any aromatic groups and (ii) a fluorinated polymer, and the processing composition layer comprises a resin that comprises one or more optionally substituted azole groups, one or more optionally substituted tetrazole groups, one or more optionally substituted triazole groups, one or more optionally substituted imidazole groups, or one or more optionally substituted benzotriazole groups.

2. The substrate of claim 1 wherein the silicon oxynitride layer is capped with a silicon oxide.

3. The substrate of claim 1 wherein the processing composition layer comprises a material that contains hydroxy or epoxy groups.

4. The substrate of claim 1 wherein the processing composition layer comprises a resin that contains one or more oxygen, sulfur or nitrogen atoms.

5. The substrate of claim 1 wherein the processing composition layer comprises an acid or acid generator compound.

6. The substrate of claim 1 wherein the processing composition layer has a dried layer thickness of less than about 50 nm.

7. The substrate of claim 1 wherein the processing composition layer has a dried layer thickness of from about 15 to 30 nm.

8. The substrate of claim 1 wherein the photoresist composition is a positive-acting chemically-amplified photoresist.

9. The substrate of claim 1 wherein the photoresist composition is a negative-acting photoresist.

10. The substrate of claim 1 wherein the processing layer comprises a resin that comprises epoxy groups.

11. The substrate of claim 1 wherein the processing layer comprises a resin that comprises one or more nitrogen atoms.

12. The substrate of claim 1 wherein the processing composition layer comprises a resin that comprises one or more non-aromatic ring groups.

13. A method for forming a photoresist relief image comprising:

applying a processing composition coating layer on a silicon oxynitride layer, the processing layer comprising one or more optionally substituted azole groups, one or more optionally substituted tetrazole groups, one or more optionally substituted triazole groups, one or more optionally substituted imidazole groups, or one or more optionally substituted benzotriazole groups;

crosslinking the processing layer;

crosslinking the processing composition coating layer; and thereafter applying over the crosslinked processing composition coating layer a coating layer of a photoresist composition;

exposing the applied photoresist layer to activating patterned radiation having a wavelength of less than 200 nm and developing the exposed photoresist layer to provide a photoresist relief image.

14. The method of claim 13 wherein the photoresist layer is exposed to radiation having a wavelength of about 193 nm.

15. The method of claim 13 wherein the processing layer comprises a resin that comprises epoxy groups.

16. The method of claim 13 wherein the processing layer comprises a resin that comprises one or more nitrogen atoms.

17. The method of claim 13 wherein the processing layer comprises a thermal acid generator.

18. The method of claim 13 wherein the processing layer comprises as separate components: (i) resin that has one or more nitrogen, oxygen or sulfur atoms; (ii) a crosslinker; and (iii) a thermal acid generator.

* * * * *